US008754668B2

(12) United States Patent
Amon et al.

(10) Patent No.: US 8,754,668 B2
(45) Date of Patent: Jun. 17, 2014

(54) INTEGRATED CIRCUIT AND A METHOD FOR TESTING A MULTI-TAP INTEGRATED CIRCUIT

(75) Inventors: Yossi Amon, Kirat Tivon (IL); Dimitri Akselrod, Modi'in (IL); Eyal Segev, Tel Aviv (IL)

(73) Assignee: Freescale Semiconductor, Inc., Austin, TX (US)

( * ) Notice: Subject to any disclaimer, the term of this patent is extended or adjusted under 35 U.S.C. 154(b) by 2114 days.

(21) Appl. No.: 11/719,924

(22) PCT Filed: Nov. 22, 2004

(86) PCT No.: PCT/EP2004/014805
§ 371 (c)(1),
(2), (4) Date: Sep. 18, 2009

(87) PCT Pub. No.: WO2006/053587
PCT Pub. Date: May 26, 2006

(65) Prior Publication Data
US 2010/0019794 A1    Jan. 28, 2010

(51) Int. Cl.
*G01R 31/28* (2006.01)
(52) U.S. Cl.
USPC .................................................. 324/763.01
(58) Field of Classification Search
USPC .......... 324/763.01, 762.06, 762.08, 500, 610, 324/600; 714/717–729
See application file for complete search history.

(56) References Cited

U.S. PATENT DOCUMENTS

| | | | | |
|---|---|---|---|---|
| 5,260,949 A | * | 11/1993 | Hashizume et al. | 714/731 |
| 5,377,198 A | * | 12/1994 | Simpson et al. | 714/727 |
| 6,073,254 A | | 6/2000 | Whetsel | |
| 6,314,539 B1 | | 11/2001 | Jacobson et al. | |
| 6,861,866 B2 | | 3/2005 | Han | |
| 7,401,277 B2 | | 7/2008 | Yamada et al. | |

OTHER PUBLICATIONS

Chinese Application No. 200480044449.2, Office Action—Rejection dated 20090417.
EPC Application No. 04 804 391.3-2216, Office Action—Rejection dated 20070914.
EPC Application No. 04 804 391-2216, Office Action—Notice of Allowance dated Apr. 2, 2008.
PCT International Application No. PCT/EP2004/014805—International Search Report and Written Opinion dated Jul. 26, 2005.

* cited by examiner

*Primary Examiner* — Melissa Koval
*Assistant Examiner* — Trung Nguyen

(57) ABSTRACT

An integrated circuit that includes a controller for defining a test path that comprises at least one test access port out of multiple test access ports characterized by further comprising at least one multi-bit bypass logic for bypassing at least one of the multiple test access ports and for affecting a length of the test path. Conveniently, the length of the test path remains substantially fixed regardless of changes in a configuration of the test path. A method for testing an integrated circuit, the method includes a stage of propagating test signals across a test path. Whereas the method is characterized by a stage of defining a configuration of the test path, whereas the test path comprises at least one components out of at least one test access port and at least one bypass access logic; whereas the at least one multi-bit bypass logic bypass at least one of the multiple test access ports and affect a length of the test path.

18 Claims, 6 Drawing Sheets

PRIOR ART

FIG. 2    60

INTEGRATED CIRCUIT AND A METHOD FOR TESTING A MULTI-TAP INTEGRATED CIRCUIT

FIELD OF THE INVENTION

The present invention relates to integrated circuits that include multiple test access ports and to a method of testing such integrated circuits.

BACKGROUND OF THE INVENTION

The complexity of integrated circuits forced designers to use various testing procedures and architectures. One common architecture and protocol is defined at IEEE standard 1149.1 that is also known as JTAG.

FIG. 1 illustrates a prior art JTAP compliant test access port (TAP) 10 and a core 11 that is connected to the TAP 10. TAP 10 includes a boundary scan register 30, a one-bit long bypass register 12, an instruction register 18, a TAP controller 20, and an optional user defined data register 14.

TAP 10 receives various signals including a clock signal TCK, a test data input signal TDI, a test mode select signal TMS and outputs a test data output signal TDO.

Various control signals provided by the TAP controller 20, especially in response to TMS signals select a path between the TDI and TDO ports of TAP 10.

The instruction register 18 forms an instruction path while each of the boundary scan register 30, bypass register 12 and the optional user defined data register 14 defines a data path. Each data path and instruction path can be regarded as an internal test path of TAP 10.

The TAP controller 20 is a state machine that is controlled by the TMS signal. FIG. 2 illustrates the multiple states of the TAP controller 20: Test logic reset 40, run-test/idle 41, select DR scan 42, capture DR 43, shift DR 44, exit1 DR 45, pause DR 46, exit2 DR 47, update DR 48, select IR scan 52, capture IR 53, shift IR 54, exit1 IR 55, pause IR 56, exit2 IR 57 and update IR 58. The stages are illustrates as boxes that are linked to each other by arrows. The arrows are accompanied by digits (either 0 or 1) that illustrate the value of the TMS signal. These stages are well known in the art and require no further explanation.

Generally, the TAP controller 20 sends control signals that allow to input information into selected data and instruction paths, to retrieve information from said paths and to serially propagate (shift) information along data and instruction paths.

Typically, the instruction register 18 includes an instruction shift register as well as a shadow latch. Signals propagate serially through the instruction shift register and are provided in parallel to the shadow latch.

The IEEE standard 1149.1 defines mandatory instructions such as BYPASS instruction that selects an internal test path that includes the one-bit long bypass register, an EXTEST instruction that causes the integrated circuit to enter an external boundary test mode, and a SAMPLE/PRELOAD instruction that selects an internal test path that includes the boundary scan register, and a EXTEST instruction that causes the TAP to enter an external boundary test mode.

The IEEE standard 1149.1 also defines optional instructions such as CLAMP instruction, HIGHZ instruction, IDCODE instruction, INTEST instruction that causes the integrated circuit to enter an internal boundary test mode, RUNBIST instruction that causes the integrated circuit to enter a self test mode, and USERCODE instruction that selects an internal test path that includes an ID register.

The IEEE standard 1149.1 is suited for single core integrated circuits. The adaptation of that standard to multi-core integrated circuits such as system on chips is not trivial. For example, such an adaptation requires a provision of a one-bit long bypass register even if multiple TAP controllers exist within a single integrated circuit.

Various examples to adapt the IEEE standard 1149.1 to multiple core integrated circuits are known in the art. Some are described in U.S. Pat. No. 6,073,254 of Whetsel and U.S. Pat. No. 6,311,302 of Cassetti et al., both incorporated herein by reference.

One prior art for testing a multiple TAP integrated circuit is to provide a test path by selectively linking one or more TAPs between the TDI and TDO pins of an integrated circuit. This results in varying the length of the test path, and complicates the testing procedure, due to the need to adapt to timing variations resulting from the differing test path length. Said adjustments complicate re-using existing software modules and complicates the testing procedure.

There is a need to provide a method and apparatus for testing a multiple TAP system.

SUMMARY OF THE PRESENT INVENTION

An integrated circuit and a method for testing an integrated circuit as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following description relates to a certain system on chip and to a bypass logic that enables bypassing a single TAP. It is noted that the invention can be applied within other systems or devices and that multiple TAPS can be bypassed by one or more bypass logic.

The invention allows to re-use existing TAPs and adding a dedicated bypass circuitry, thus simplifying the cost of design.

Conveniently, the length of the test path, and especially the instruction register chain, remains substantially fixed regardless of changes in a configuration of the test path.

Figure 1:
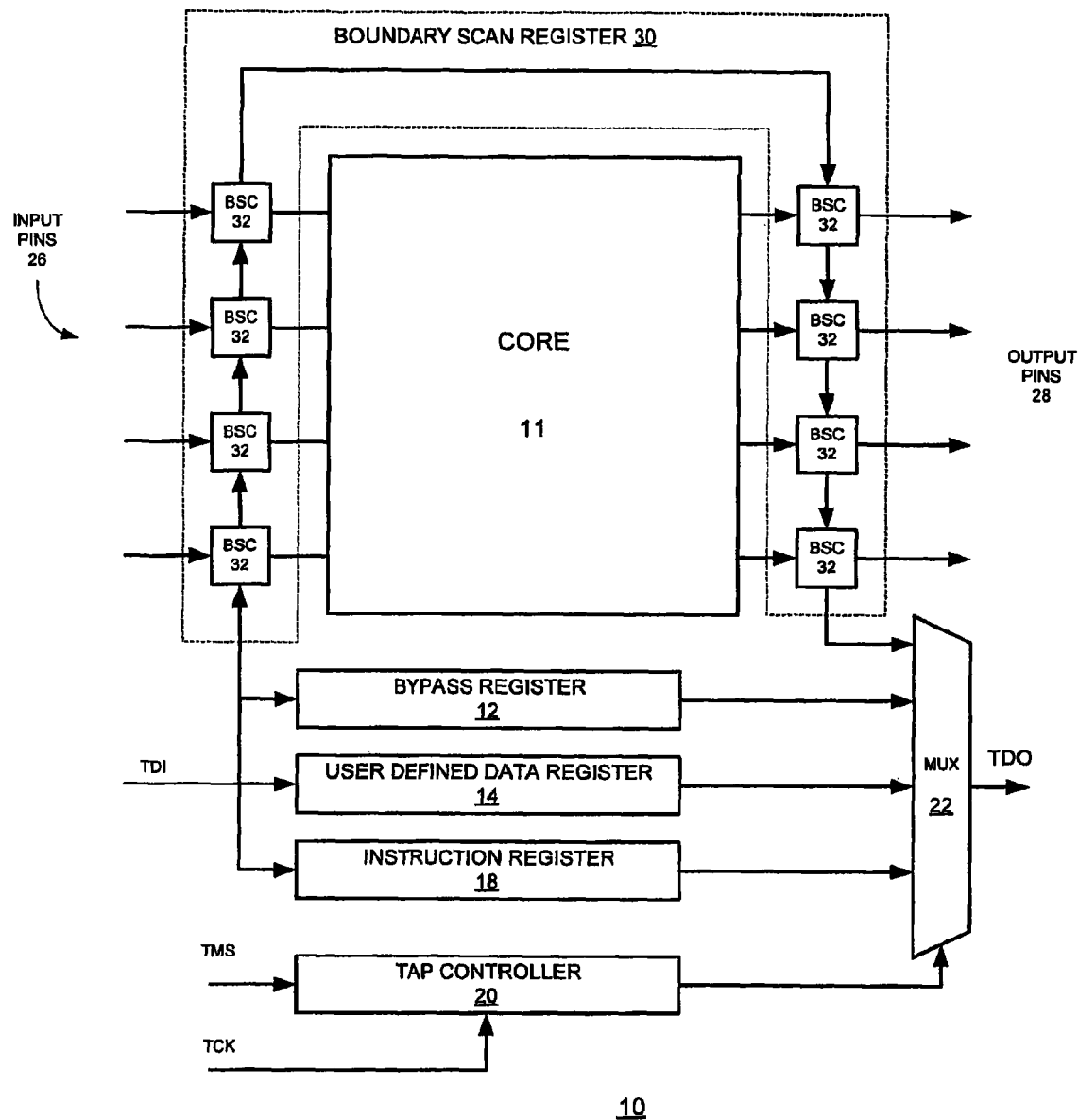
FIG. 1 is a schematic diagram of a prior art TAP and a core.
Figure 2:
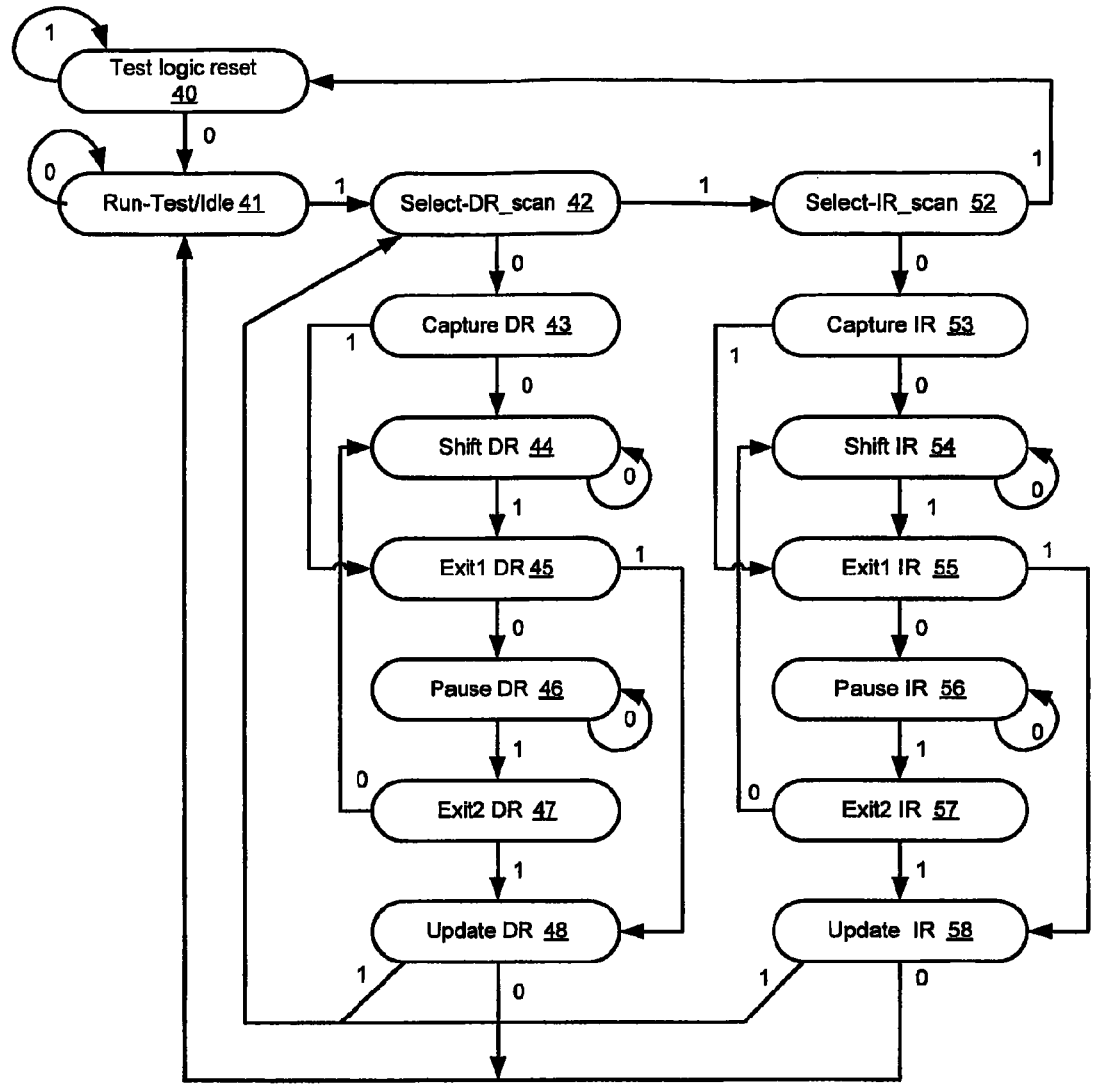
FIG. 2 is a flow chart illustrating various states of a prior art TAP controller.
Figure 3:
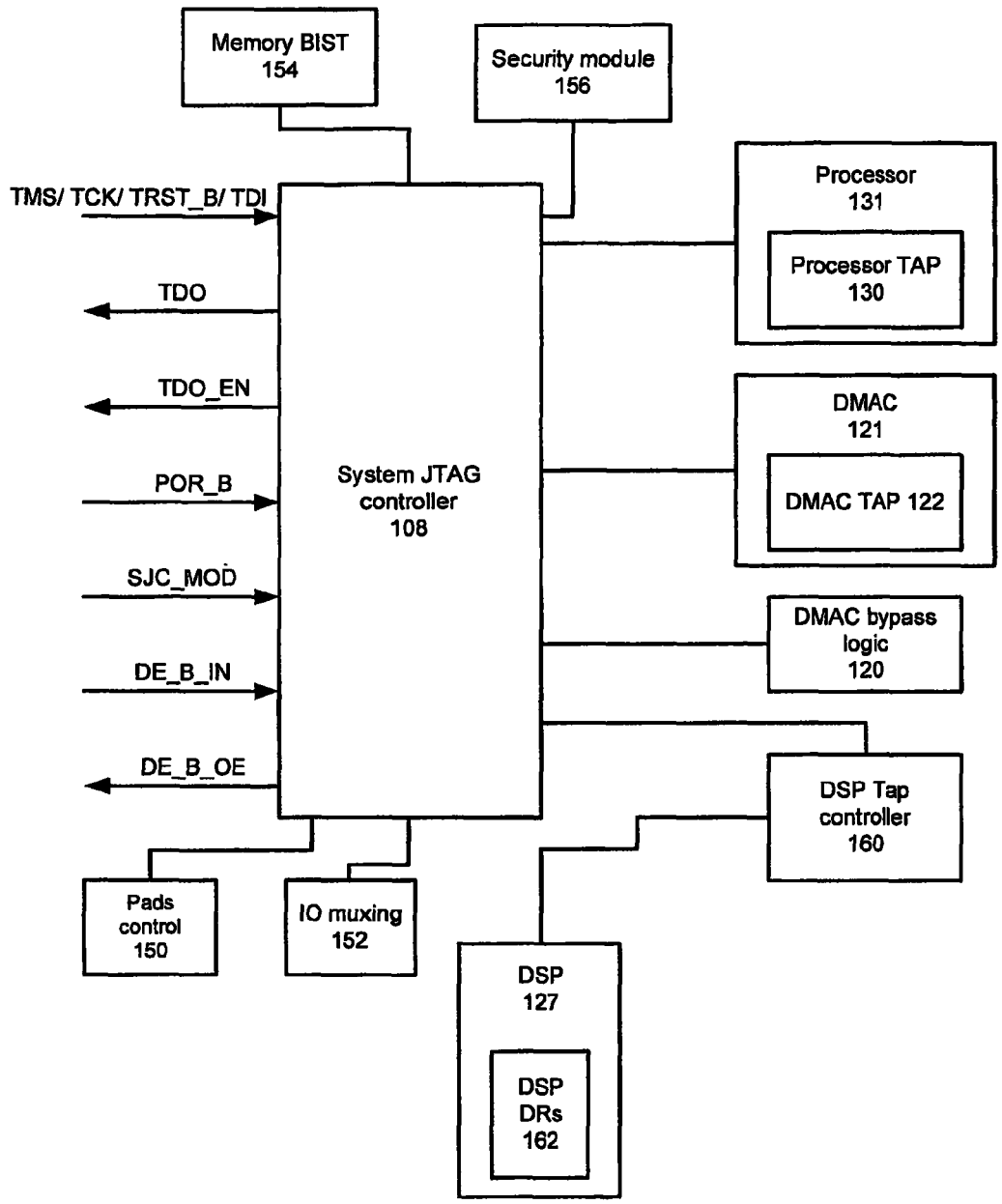
FIG. 3 illustrates a system on chip, according to an embodiment of the invention.

FIG. 3 illustrates an integrated circuit such as a system on chip (system) 100, according to an embodiment of the invention. FIG. 3 describes some of the signals provided to the system JTAG controller 108 and describes the logic relation between various components of the system 100. It does not illustrate in great details the exact connectivity between the components.

System 100 includes two processors—processor 131 and a digital signal processor core (DSP) 127. The inventor used an ARM™ processor and a StarCore 140™ DSP, but other cores can be utilized.

System 100 further includes: (i) a memory module (not shown) that is connected to a built in self test module 154, (ii) a security module 156, (iii) a direct memory access controller (DMAC) 121 that includes a DMAC TAP 122, (iv) DMAC bypass logic 120, and (v) pad control unit 150 and 10 multiplexing unit 153 that control the reception and provision of various signals via the pads of system 100.

The data registers 162 of the DSP are connected to the DSP TAP controller 160 and are controlled by it. Conveniently these data registers receive TDI, TCK TRST and TMS signals.

Figure 4:
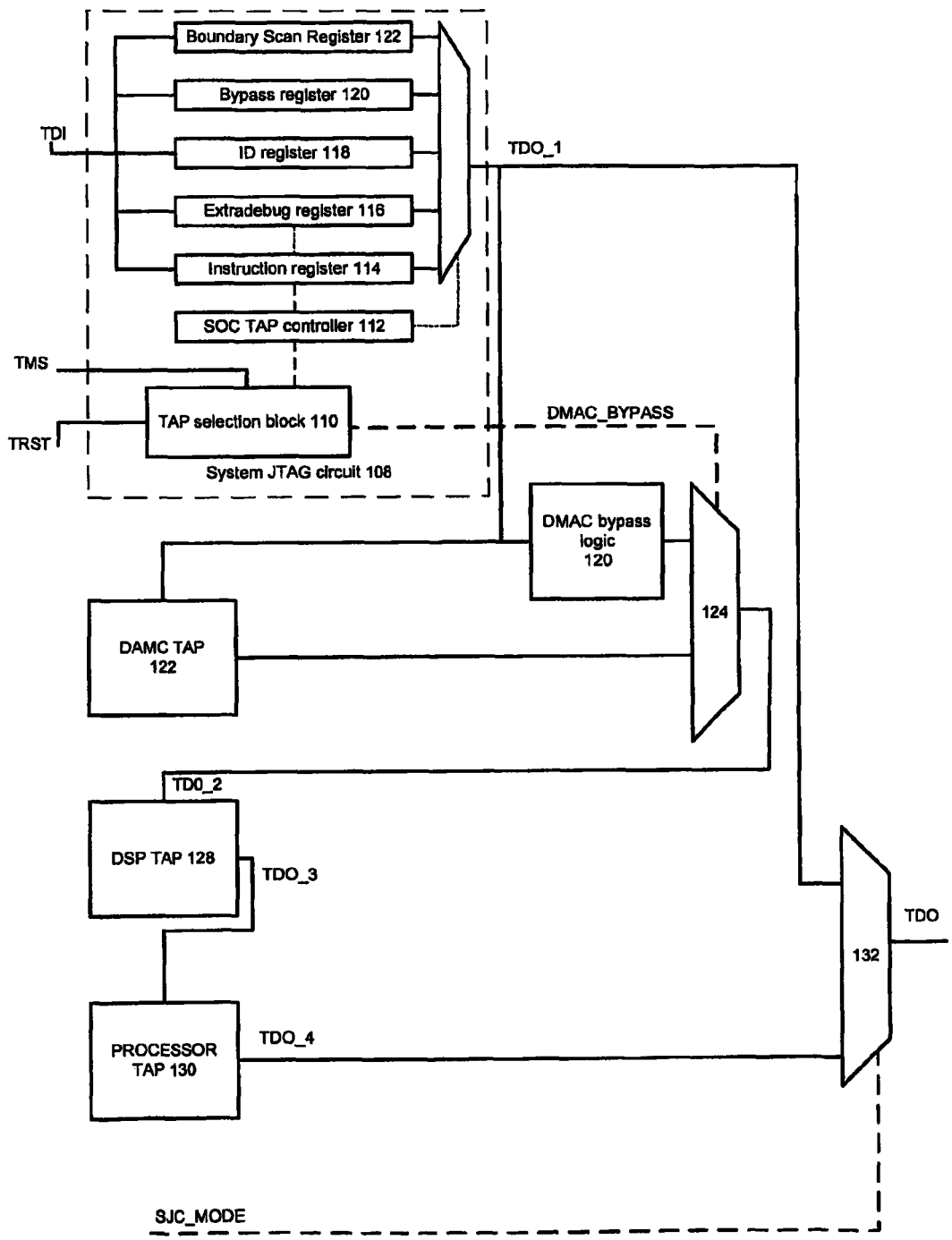
FIG. 4 illustrates a portion of a system on chip that includes multiple TAPs and a single bypass logic, according to an embodiment of the invention.

As further illustrated in FIG. 4, the DMAC bypass logic allows bypassing the DMAC TAP 122. In system 100 the maximal clock frequency of the DMAC 121 is much lower (about 20%) of the clock frequency of other components such as DSP 127 and processor 131. This greatly reduces the operation frequency of any test path that includes DMAC TAP 122. Thus, by bypassing the DMAC TAP 122 various tests can be accelerated. Typically, the operation frequency of the TAP is smaller than the operation frequency of the cores. The inventors used a 1:8 ratio between said operation frequencies. Thus, a slow component can dramatically slow down any JTAG testing.

It is noted that that amount of bypassed TAPs can differ from the amount of the bypassing logics that bypass these TAPs. For example, a single TAP can be bypassed by using one or more bypass logics, and even multiple TAPs can be bypassed by one bypass logics.

It is further noted that a TAP can be bypassed for reasons other than clock frequency. For example, if one or more TAPs are tested, other one or more TAPs can be bypassed.

The system JTAG controller 108 receives multiple signals including POR_B, TCK, TDI, TMS, TRST_B, DE_IN_B and a SJC_MODE signal and outputs various signals including TDO, TDO_EN, and a DE_B_OE signal.

POB_B is a power on reset input signal that can be provided from a pad of the system 100 or from an internal component of the system 100. TDO_EN enables a tri-state buffer that is connected to a TDO pad of system 100. TRST_B is used to asynchronously initialize the system JTAG controller 108. DE_IN_B and DE_B_OE are system on chip debug request/acknowledgement pins that are usually used to propagate a debug request to the processors.

FIG. 4 illustrates a portion 90 of system 100 that includes multiple TAPs and a single bypass logic 120, according to an embodiment of the invention.

Portion 90 includes a system JTAG controller 108, DMAC bypass logic 120, multiplexer 124 and 132, DMAC TAP 122, DSP TAP 128 and processor TAP 130. It is noted that one or more TAPS can be integrated, but this is not necessarily so.

The SJC_MODE signal is conveniently received from a dedicated pin 201, and facilitates a selection between test paths of different length. The first test path includes system JTAG controller 108 as well as a sequence of TAPs 128, 130 and one out of DMAC TAP 122 or DMAC bypass logic 120. The second test path includes only the system JTAG controller 108, that in turn includes a one-bit long bypass register 120. The SJC_MODE signal controls a multiplexer 132 that receives either a test data output signal (denoted TDO_4) from processor TAP 130 or receives the test data output signal TDO_1 from the system JTAG controller 108.

The DMAC bypass logic 120 and DMAC TAP 122 are connected in parallel between the output (TDO_1) of the system JTAG controller 108 and between a multiplexer 124 that selects which of these two components to connect to an input of the DSP TAP 128. The selection is responsive to a DMAC_BYPASS control signal provided by a TAP selection block 110 within the system JTAG controller 108.

The signal (TDO_2) outputted from multiplexer 124 is provided to the TDI input of DSP TAP 128. The signal (TDO_3) outputted from DSP TAG 128 is provided to the TDI input of processor TAP 130.

The system JTAG controller 108 can be regarded as a TAP as it includes a boundary scan register 122, a one-bit long bypass register 120, an identification (ID) register 118, an instruction register 114, a debug register 116, a SOC TAP controller 112 and a multiplexer for selecting which register provides the test data output signal TDO_1.

The debug register 116 allows a collection of debug information from system 100. The ID register 118 provides information about the manufacturer, part number and version of system 100. The security module 156 allows to limit the access of some of the system registers by requiring to provide a certain key, to permanently prevent access to certain registers or to allow access to registers without limitation.

The system JTAG controller 108 also includes a TAP selection block 110 that is used to select whether to bypass the DMAC TAP 122. It is noted that components (such as registers) that allow to select certain TAPs can be provided outside the system JTAG controller 108, for example for increasing the reliability of the system 100 or for allowing to bypass the system JTAG controller 108.

DMAC TAP 122 includes at least one data path and at least one instruction path. Each of said paths has a certain length. In other words, each path delays an incoming TDI signal by a certain delay period at a given operating frequency. The DMAC bypass logic 120 includes multiple components such as shift registers, that emulate the passage of data through the at least one data path of the DMAC TAP 122 and through the at least one instruction path of DMAC TAP 122. In other words, the DMAC bypass logic 120 has equivalent data paths and equivalent instruction paths to those of DMAC TAP 122. For example, if the DMAC TAP 122 includes an X-bit instruction path, as well as Y-bit, Z-bit and W-bit data paths that the DMAC bypass logic has to include data paths of Y, Z and W bits as well as a X-bit instruction path, or logic that emulates X-bit, Y-bit, Z-bit and W-bit delay. According to another embodiment of the invention the DMAC bypass logic 120 may also include one or more paths of varying length. The length can be selected such as to match a corresponding internal test path of the DMAC TAP 122.

The TAP selection block 110 includes a TAP select register and a TAP select shift register. The TAP update shift register is serially connected between TDI and TDO and is connected in parallel to a TAP select register.

The TAP select register reads the content of the TAP select shift register during the update DR stage 48 of the SOC TAP controller 112. The TAP select shift register is loaded during the shift DR state 44. The TAP select register can accessed by providing an appropriate instruction (TAP access) to the instruction register.

It is noted that FIG. 4 illustrates a control mechanism that includes a single TAP selection block and an SJC_MODE pin. It is noted that other manners to provide the required control information (for determining the configuration of the provided test path) can be provided within the scope of the invention.

For example, the SJC_MODE signal can be generated by the system JTAG controller 108 instead of being received from an external pin. According to various embodiments of the invention selection information can be provided to one or more TAPs other than the system JTAG controller 108.

According to an embodiment of the invention control information is stored within one or more memory spaces of one or more instruction registers. It is noted that if conflicting control information is provided the system 100 can resolve these conflicts in a predetermined manner, for example according to predefined priority.

Figure 5:
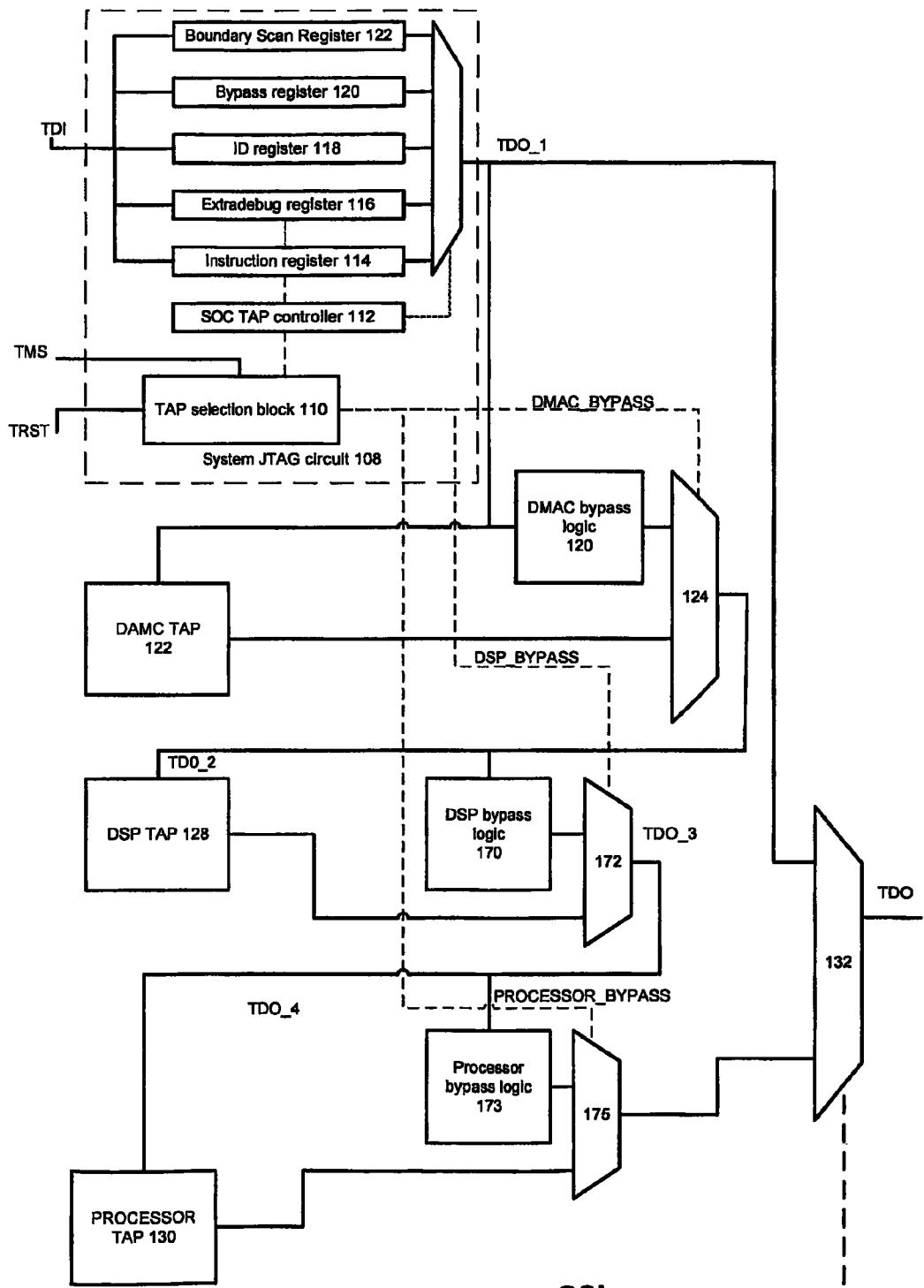
FIG. 5 illustrates a portion of a system on chip that includes multiple TAPs and a multiple bypass logics, according to an embodiment of the invention.

FIG. 5 illustrates a portion 90' of system on chip 100 that includes multiple TAPs and multiple bypass logics 120, 170 and 173, according to an embodiment of the invention.

Portion 90' of FIG. 5 differs from portion 90 of FIG. 4 by having additional bypass logics to enable bypassing the DSP TAP 128 and the processor TAP 130. A multiplexer 172 is controlled by a DSP_SELECT control signal from the TAP selection block 110 and selects whether to provide as a test data output signal TDO_3 either the output of DSP TAP 128 or the output of DSP bypass logic 170.

A further multiplexer 175 is controlled by a PROCESSOR_SELECT control signal from the TAP selection block 110 and selects whether to provide as a test data output signal TDO_4 either the output of processor TAP 130 or the output of the processor bypass logic 173.

Figure 6:
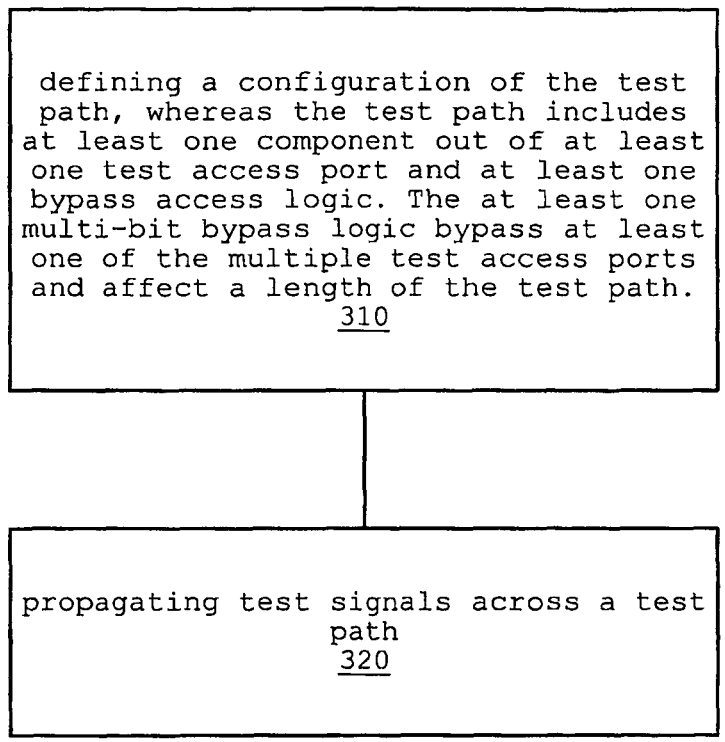
FIG. 6 is a flow chart of a method for testing, according to an embodiment of the invention.

FIG. 6 is a flow chart illustrating a method 300 for testing a system, according to an embodiment of the invention.

Method 300 starts by stage 310 of defining a configuration of the test path, whereas the test path includes at least one component out of at least one test access port and at least one bypass access logic. The at least one multi-bit bypass logic bypass at least one of the multiple test access ports and affect a length of the test path. Conveniently, the length of the test path remains unchanged even if the configuration of the test path (for example the TAPs and/or the bypass logic that form the test path) change).

It is further noted that selecting different internal paths within a certain TAP may change the length of the test path. Conveniently, that test path length can change when selecting an instruction path instead of a data path, but this change is allowed.

Conveniently, length of at least one multi-bit bypass logic corresponds to a length of an internal test path within a corresponding bypassed test access port.

Stage 310 is followed by stage 320 of propagating test signals across a test path. These signals can be provided via the TDI input of the tested system, but this is not necessarily so.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. An integrated circuit comprising:
   a controller for defining a test path that comprises at least one test access port out of multiple test access ports comprising:
   at least one multi-bit bypass logic for bypassing at least one of the multiple test access ports and for affecting a length of the test path, wherein the length of the test path remains substantially fixed regardless of changes in a configuration of the test path, wherein a bypass logic has equivalent data paths and equivalent instruction paths to those of a test access port it bypasses.

2. The integrated circuit according to claim 1, whereas a length of at least one multi-bit bypass logic corresponds to a length of an internal test path within a corresponding bypassed test access port.

3. The integrated circuit according to claim 1, further adapted to select between test paths of differing lengths.

4. The integrated circuit according to claim 3 wherein the integrated circuit comprises a pin for receiving a selection signal.

5. The integrated circuit according to claim 1, wherein at least one bypass logic comprises at least one data register and at least one instruction register.

6. The integrated circuit according to claim 1, wherein at least one bypass logic comprises a TAP controller.

7. The integrated circuit according to claim 1, wherein the test access ports are IEEE 1149.1 compliant.

8. The integrated circuit according to claim 1, wherein the controller comprises a test access port selection block.

9. The integrated circuit according to claim 1, wherein the controller comprises a test access port.

10. The integrated circuit of claim according to claim 9, wherein at least one test access port operates at a clock frequency that differs from a clock frequency of at least one other test access port.

11. A method for testing an integrated circuit, the method comprises:
    propagating test signals across a test path; and
    a stage of defining a configuration of the test path;
    whereas the test path comprises at least one components out of at least one test access port and at least one bypass access logic;
    whereas the at least one multi-bit bypass logic bypass at least one of the multiple test access ports and affect a length of the test path, wherein the length of the test path remains substantially fixed regardless of changes in a configuration of the test path;
    whereas a length of at least one multi-bit bypass logic corresponds to a length of an internal test path within a corresponding bypassed test access port.

12. The method according to claim 9, whereas the stage of defining further comprises selecting between test paths of differing lengths.

13. The method according to claim 11, wherein at least one bypass logic comprises at least one data register and at least one instruction register.

14. The method according to claim 11, wherein at least one bypass logic comprises a TAP controller.

15. The method according to claim 11, wherein the test access ports are IEEE 1149.1 compliant.

16. The method of claim according to claim 11, wherein at least one test access port operates at a clock frequency that differs from a clock frequency of at least one other test access port.

17. The method of claim according to claim 16, wherein at least one bypass logic comprises a TAP controller.

18. A method for testing an integrated circuit, the method comprises:
    propagating test signals across a test path; and
    a stage of defining a configuration of the test path;
    whereas the test path comprises at least one components out of at least one test access port and at least one bypass access logic;
    whereas the at least one multi-bit bypass logic bypass at least one of the multiple test access ports and affect a length of the test path, wherein the length of the test path remains substantially fixed regardless of changes in a configuration of the test path;

wherein a bypass logic has equivalent data paths and equivalent instruction paths to those of a test access port it bypasses.

* * * * *